(12) United States Patent
Choi et al.

(10) Patent No.: US 12,381,151 B2
(45) Date of Patent: Aug. 5, 2025

(54) SEMICONDUCTOR DEVICE AND SEMICONDUCTOR PACKAGE INCLUDING THE SAME

(71) Applicant: SAMSUNG ELECTRONICS CO., LTD., Suwon-si (KR)

(72) Inventors: Ju-Il Choi, Seongnam-si (KR); Gyuho Kang, Cheonan-si (KR); Seong-Hoon Bae, Cheonan-si (KR); Dongjoon Oh, Suwon-si (KR); Chungsun Lee, Asan-si (KR); Hyunsu Hwang, Siheung-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 68 days.

(21) Appl. No.: 18/196,077

(22) Filed: May 11, 2023

(65) Prior Publication Data
US 2023/0282582 A1  Sep. 7, 2023

Related U.S. Application Data

(63) Continuation of application No. 17/147,661, filed on Jan. 13, 2021, now Pat. No. 11,664,312.

(30) Foreign Application Priority Data

Jun. 5, 2020  (KR) .......................... 10-2020-0068562

(51) Int. Cl.
| | | |
|---|---|---|
| H01L 23/532 | (2006.01) | |
| H01L 23/00 | (2006.01) | |
| H01L 23/48 | (2006.01) | |
| H01L 23/522 | (2006.01) | |

(52) U.S. Cl.
CPC ...... *H01L 23/53238* (2013.01); *H01L 23/481* (2013.01); *H01L 23/5226* (2013.01);
(Continued)

(58) Field of Classification Search
CPC ... H01L 24/05; H01L 24/16; H01L 21/76898; H01L 23/53238; H01L 23/481;
(Continued)

(56) References Cited

U.S. PATENT DOCUMENTS

| | | |
|---|---|---|
| 5,880,010 A | 3/1999 | Davidson |
| 6,503,835 B1 | 1/2003 | Lee |
| 7,157,787 B2 | 1/2007 | Kim et al. |

(Continued)

FOREIGN PATENT DOCUMENTS

| | | |
|---|---|---|
| JP | 5407660 B2 | 11/2013 |
| KR | 10-2017-0139342 A | 12/2017 |

*Primary Examiner* — Zandra V Smith
*Assistant Examiner* — John M Parker
(74) *Attorney, Agent, or Firm* — Muir Patent Law, PLLC

(57) ABSTRACT

A semiconductor device includes a first semiconductor chip that includes a first conductive pad whose top surface is exposed; and a second semiconductor chip that includes a second conductive pad whose top surface is exposed and in contact with at least a portion of the top surface of the first conductive pad. The first semiconductor chip may include a first diffusion barrier in contact with a bottom surface of the first conductive pad, and a second diffusion barrier in contact with a lateral surface of the first conductive pad, and the first diffusion barrier and the second diffusion barrier may include different materials from each other.

20 Claims, 18 Drawing Sheets

(52) U.S. Cl.
CPC .......... *H01L 23/5329* (2013.01); *H01L 24/05*
(2013.01); *H01L 24/08* (2013.01); *H01L 24/16*
(2013.01); *H01L 2224/05647* (2013.01); *H01L*
*2224/08145* (2013.01); *H01L 2224/16227*
(2013.01)

(58) Field of Classification Search
CPC ........... H01L 23/53295; H01L 23/5329; H01L
2224/05647; H01L 2224/0401; H01L
2224/08145; H01L 25/0657; H01L 25/50
See application file for complete search history.

(56) References Cited

U.S. PATENT DOCUMENTS

| | | |
|---|---|---|
| 8,482,132 B2 | 7/2013 | Yang et al. |
| 8,896,121 B2 | 11/2014 | Chapelon |
| 9,027,821 B2 | 5/2015 | De Cioccio et al. |
| 9,142,517 B2 | 9/2015 | Liu et al. |
| 9,224,704 B2 | 12/2015 | Landru |
| 9,620,481 B2 | 4/2017 | Edelstein et al. |
| 10,090,351 B2 | 10/2018 | Ashidate et al. |
| 10,431,621 B2 | 10/2019 | Kagawa et al. |
| 2002/0155722 A1* | 10/2002 | Satta ................. H01L 21/76807 |
| | | 257/E21.582 |
| 2003/0116439 A1* | 6/2003 | Seo ................... H01L 21/76885 |
| | | 257/E21.174 |
| 2015/0108644 A1 | 4/2015 | Kuang et al. |
| 2015/0364434 A1 | 12/2015 | Chen et al. |
| 2016/0013160 A1 | 1/2016 | Chun et al. |
| 2017/0358553 A1 | 12/2017 | Kim et al. |
| 2019/0148336 A1 | 5/2019 | Chen et al. |
| 2020/0098711 A1 | 3/2020 | Choi et al. |

\* cited by examiner

SEMICONDUCTOR DEVICE AND SEMICONDUCTOR PACKAGE INCLUDING THE SAME

CROSS-REFERENCE TO RELATED APPLICATION

This is a continuation of U.S. patent application Ser. No. 17/147,661 filed Jan. 13, 2021, which is incorporated by reference herein in its entirety.

Korean Patent Application No. 10-2020-0068562, filed on Jun. 5, 2020, in the Korean Intellectual Property Office, and entitled: "Semiconductor Device and Semiconductor Package Including the Same," is incorporated by reference herein in its entirety.

BACKGROUND

1. Field

Embodiments relate to a semiconductor device and a semiconductor package including the same.

2. Description of the Related Art

A semiconductor package may be provided to implement an integrated circuit chip for use in electronic products. A semiconductor package may be configured such that a semiconductor chip is mounted on a printed circuit board. Bonding wires or bumps may be used to electrically connect the semiconductor chip to the printed circuit board. With the development of electronic industry, various studies have been conducted to improve reliability and durability of semiconductor packages.

SUMMARY

Embodiments are directed to a semiconductor device, including: a first semiconductor chip that includes a first conductive pad whose top surface is exposed; and a second semiconductor chip that includes a second conductive pad whose top surface is exposed and in contact with at least a portion of the top surface of the first conductive pad. The first semiconductor chip may include: a first diffusion barrier in contact with a bottom surface of the first conductive pad; and a second diffusion barrier in contact with a lateral surface of the first conductive pad. The first diffusion barrier and the second diffusion barrier may include different materials from each other.

Embodiments are also directed to a semiconductor device, including: a first semiconductor chip that includes a first conductive pad whose top surface is exposed; and a second semiconductor chip that includes a second conductive pad whose top surface is exposed and in contact with at least a portion of the top surface of the first conductive pad. The first semiconductor chip may include: a first semiconductor substrate; a first wiring layer between the first semiconductor substrate and the first conductive pad; and a first dielectric structure on the first wiring layer, the first dielectric structure surrounds a lateral surface of the first conductive pad. The first dielectric structure may include: a first organic layer in contact with the lateral surface of the first conductive pad and a top surface of the first wiring layer, the first organic layer extending onto the top surface of the first wiring layer; and a first silicon oxide layer on the first organic layer and spaced apart in a first direction from the lateral surface of the first conductive pad across the first organic layer, the first direction being parallel to a top surface of the first semiconductor substrate.

Embodiments are also directed to a semiconductor package, including: a first semiconductor chip that includes a plurality of first copper pads whose top surfaces are exposed; and a second semiconductor chip that includes a plurality of second copper pads whose top surfaces are exposed and correspondingly in partial contact with the top surfaces of the first copper pads. The first semiconductor chip may include: a semiconductor substrate; a wiring layer between the semiconductor substrate and the first copper pads; a conductive layer between the wiring layer and the first copper pads, the conductive layer being in contact with a top surface of the wiring layer and a bottom surface of the first copper pad; and a dielectric structure on the wiring layer, the dielectric structure surrounding a lateral surface of the first copper pad. The dielectric structure may include: a first dielectric layer that contacts the lateral surface of each of the first copper pads and extends onto the top surface of the wiring layer; and a second dielectric layer on the first dielectric layer and spaced apart in a direction from the lateral surface of the first copper pad across the first dielectric layer, the direction being parallel to a top surface of the semiconductor substrate. The second dielectric layer may include a silicon oxide layer. A diffusion rate of copper in the conductive layer and a diffusion rate of copper in the first dielectric layer may be less than a diffusion rate of copper in the second dielectric layer.

BRIEF DESCRIPTION OF THE DRAWINGS

Features will become apparent to those of skill in the art by describing in detail example embodiments with reference to the attached drawings in which.

DETAILED DESCRIPTION

The following will now describe a semiconductor device and a semiconductor package including the same with reference to the accompanying drawings.

Figure 1:
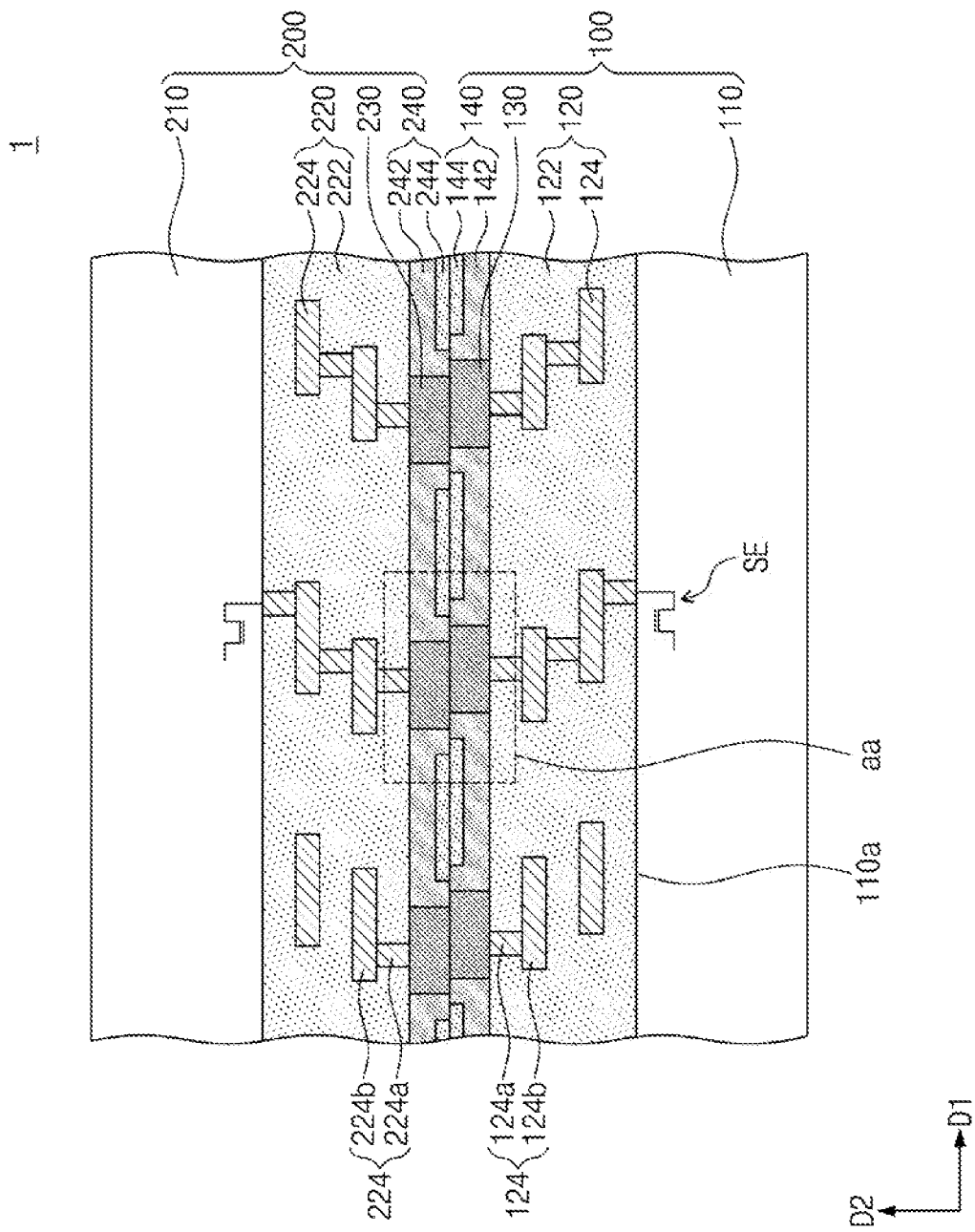
FIG. 1 illustrates a cross-sectional view partially showing a semiconductor device according to an example embodiment.
Figure 2:
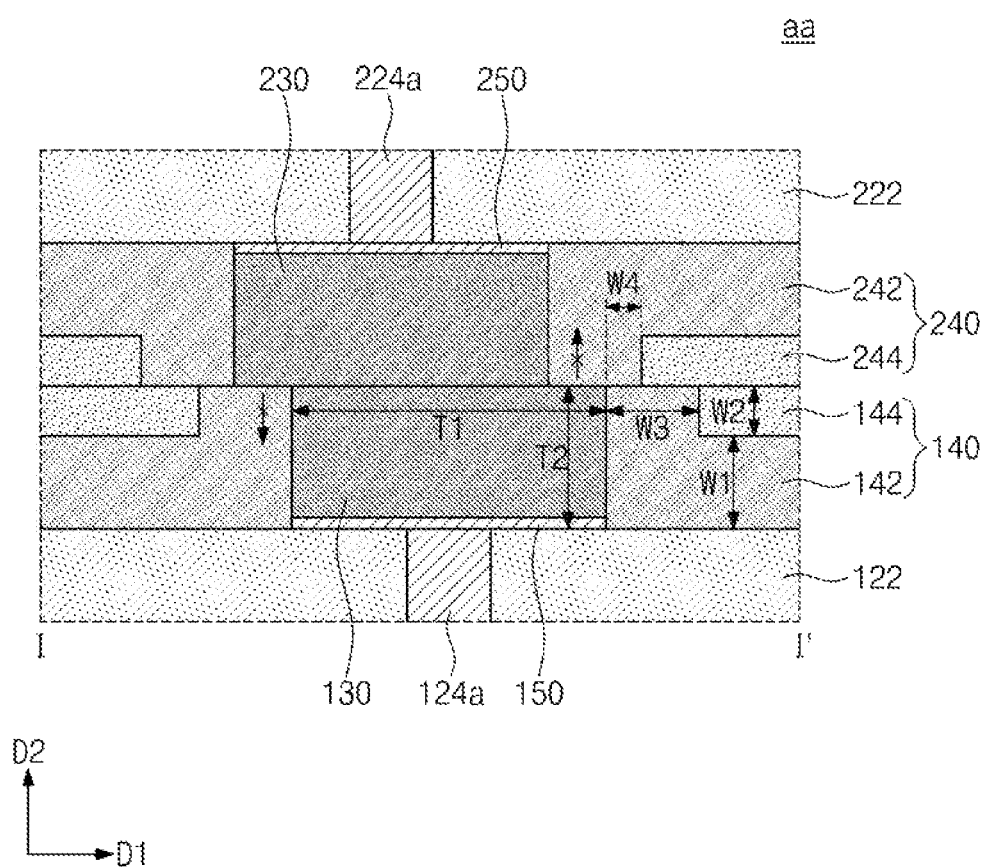
FIG. 2 illustrates an enlarged view showing section aa of FIG. 1.
Figure 3:
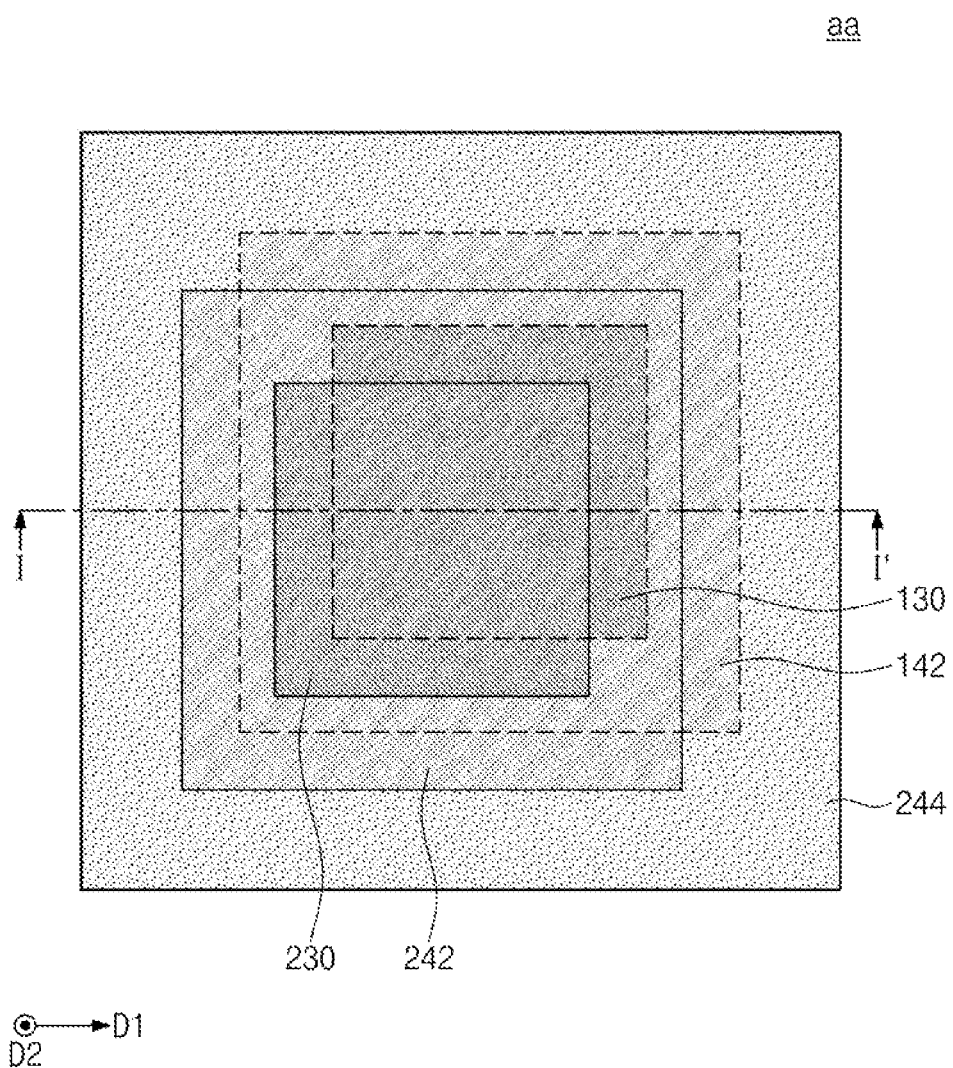
FIG. 3 illustrates a plan view corresponding to a cross-section taken along line I-I' of FIG. 2.

FIG. 1 illustrates a cross-sectional view showing a semiconductor device according to an example embodiment. FIG. 2 illustrates an enlarged view showing section aa of FIG. 1. FIG. 3 illustrates a plan view corresponding to a cross-section taken along line I-I' of FIG. 2.

Referring to FIGS. 1, 2, and 3, a semiconductor device 1 according to the present example embodiment may have a structure in which a first semiconductor chip 100 and a second semiconductor chip 200 are bonded to each other.

The first semiconductor chip 100 may include a first semiconductor substrate 110, a first wiring layer 120, a first conductive pad 130, and a first dielectric structure 140.

The first semiconductor substrate 110 may include a semiconductor element, such as silicon (Si) or germanium (Ge). Additionally or alternatively, the first semiconductor substrate 110 may include a compound semiconductor, such as silicon carbide (SiC), gallium arsenide (GaAs), indium arsenide (InAs), or indium phosphide (InP). The first semiconductor substrate 110 may have a silicon-on-insulator (SOI) structure. For example, the first semiconductor substrate 110 may include a buried oxide (BOX) layer. The first semiconductor substrate 110 may include a conductive region, such as an impurity-doped well or an impurity-doped structure. The first semiconductor substrate 110 may include various device isolation structures, such as a shallow trench isolation (STI) structure.

The first semiconductor substrate 110 may include a first circuit layer, which first circuit layer may be provided on or near a front surface 110a of the first semiconductor substrate 110. The first circuit layer may include a component SE, such as a transistor.

The first wiring layer 120 may be provided on the front surface 110a of the first semiconductor substrate 110. The first wiring layer 120 may include a first dielectric layer 122 and a first wiring structure 124 disposed in the first dielectric layer 122. The first wiring structure 124 may include, for example, first vias 124a and/or first wiring lines 124b. The first wiring structure 124 may electrically connect the component SE of the first circuit layer and the conductive region of the first semiconductor substrate 110 to the first conductive pad 130, which will be discussed below.

The first dielectric layer 122 may include a single dielectric layer or a plurality of dielectric layers. The single-layered first dielectric layer 122 may include, for example, silicon oxide ($SiO_2$). According to an example embodiment, each of the plurality of dielectric layers may include silicon oxide ($SiO_2$) and/or silicon nitride (SiN). According to an example embodiment, when the first dielectric layer 122 includes a plurality of dielectric layers, a silicon oxide ($SiO_2$) layer may occupy an uppermost one of the plurality of dielectric layers.

The first conductive pad 130 may be provided on the first via 124a positioned on an uppermost portion of the first wiring layer 120. The first conductive pad 130 may be a copper pad. A top surface of the first conductive pad 130 may be exposed, and neither bottom nor lateral surfaces of the first conductive pad 130 may exposed. The first conductive pad 130 may have a tetragonal shape, a cylindrical shape, or any other suitable shape. The first conductive pad 130 may have a first width T1 in a first direction D1. The first width T1 may range from about 0.8 μm to about 3 μm. As shown in FIG. 2, a first diffusion barrier 150 may be interposed between the first conductive pad 130 and the first dielectric layer 122. The first diffusion barrier 150 may be locally provided locally only on the bottom surface of the first conductive pad 130 and may not extend onto the lateral surface of the first conductive pad 130. When viewed in plan, the first diffusion barrier 150 may vertically overlap the bottom surface of the first conductive pad 130.

The first diffusion barrier 150 may contact the bottom surface of the first conductive pad 130. The first diffusion barrier 150 may be a conductive layer including a conductive material. The first diffusion barrier 150 may serve to prevent diffusion of metal (such as copper) from the first conductive pad 130 into the first dielectric layer 122. The first diffusion barrier 150 may have a stack structure including one or more selected from, for example, titanium (Ti), tantalum (Ta), titanium nitride (TiN), and tantalum nitride (TaN). A thickness T2 in a second direction D2 between a bottom surface of the first diffusion barrier 150 and the top surface of the first conductive pad 130 may be equal to or less than about 1.5 times the first width T1 of the first conductive pad 130. For example, the thickness T2 may range from about 1.2 μm to about 4.5 μm.

The first dielectric structure 140 may be provided on the first wiring layer 120. The first dielectric structure 140 may include a second diffusion barrier 142 and a first inorganic layer 144. The second diffusion barrier 142 may be called a first organic layer. The second diffusion barrier 142 may serve to prevent diffusion of metal (such as copper) from the first conductive pad 130 into an adjacent layer, for example, a silicon oxide layer. The second diffusion barrier 142 may include at least one selected from polyimide (PI), polybenzoxazole (PBO), and polyhydroxystyrene (PHS). The second diffusion barrier 142 may include a different material from that of the first diffusion barrier 150.

The second diffusion barrier 142 may contact the lateral surface of the first conductive pad 130. The first diffusion barrier 150 may not be present between the second diffusion barrier 142 and the first conductive pad 130.

Referring to FIG. 2, the second diffusion barrier 142 may extend, from the lateral surface of the first conductive pad 130, along the first direction D1 parallel to the front surface 110a of the first semiconductor substrate 110 so as to cover a top surface of the first dielectric layer 122. The second diffusion barrier 142 may have a bottom surface in contact with the top surface of the first dielectric layer 122. The second diffusion barrier 142 may have a thickness W1 ranging, for example, from about 0.3 μm to about 2 μm. As described in further detail below, the thickness W1 of the second diffusion barrier 142 may be set in consideration of a degree of misalignment in an operation shown in FIG. 10, in which a first wafer WF1 and a second wafer WF2 are bonded to each other during the fabrication of the semiconductor device 1.

The first inorganic layer 144 may be provided on the second diffusion barrier 142. In the description below, the first inorganic layer 144 may also be called a first silicon oxide layer.

A portion of the second diffusion barrier 142 may be covered with the first silicon oxide layer 144, and another portion of the second diffusion barrier 142 may be exposed around the first conductive pad 130. As shown in FIG. 3, when viewed in plan, the exposed portion of the second diffusion barrier 142 may annularly surround the first conductive pad 130. FIG. 3 depicts that the first conductive pad 130 has a square shape when viewed in plan, but the planar shape of the first conductive pad 130 may be varied, and this arrangement may be applied to, for example, a second conductive pad 230, which will be discussed below. For example, when viewed in plan, each of the first and second conductive pads 130 and 230 may have a rectangular shape, a circular shape, or any other suitable shape.

Referring back to FIG. 2, the first silicon oxide layer 144 may not contact the first conductive pad 130. The first silicon oxide layer 144 may be spaced apart in the first direction D1 from the lateral surface of the first conductive pad 130 across the second diffusion barrier 142. The first silicon oxide layer 144 may be spaced apart in the second direction D2, which is perpendicular to the front surface 110a of the first semiconductor substrate 110, from the first wiring layer 120 across the second diffusion barrier 142. The first silicon oxide layer 144 may have a thickness W2 that is less than the thickness W1 of the second diffusion barrier 142. An exposed surface of the second diffusion barrier 142 may have a width W3 in the first direction D1, and the width W3 may be greater than the thickness W2 of the first silicon oxide layer 144. The width W3 may range, for example, from about 0.3 μm to about 2 μm.

The top surface of the first conductive pad 130, the exposed surface of the second diffusion barrier 142, and a top surface of the first silicon oxide layer 144 may be coplanar with each other. On a top surface of the first semiconductor chip 100, the first silicon oxide layer 144 may have a planar area that is greater than that of any other component. The first silicon oxide layer 144 may serve as an adhesive layer during a procedure in which the first and second semiconductor chips 100, 200 are bonded to each other.

A diffusion rate of copper in the first diffusion barrier 150 and the second diffusion barrier 142 may be less than a diffusion rate of copper in the first silicon oxide layer 144. The diffusion rate of copper in the first diffusion barrier 150 may be less than the diffusion rate of copper in the second diffusion barrier 142. A diffusion coefficient of copper in the first diffusion barrier 150 and the second diffusion barrier 142 may be less than a diffusion coefficient of copper in silicon oxide. In this description, the diffusion rates and the diffusion coefficients in layers may be compared under the same temperature or different temperatures. When the diffusion rates and the diffusion coefficients are compared under different temperatures, the comparison may be performed at a temperature less than about 100° C.

The second semiconductor chip 200 may include a second semiconductor substrate 210, a second wiring layer 220, a second conductive pad 230, a third diffusion barrier 250, a fourth diffusion barrier 242, and a second silicon oxide layer 244. The second semiconductor substrate 210, the second wiring layer 220, the second conductive pad 230, the third diffusion barrier 250, the fourth diffusion barrier 242, and the second silicon oxide layer 244 of the second semiconductor chip 200 may respectively correspond to the first semiconductor substrate 110, the first wiring layer 120, the first conductive pad 130, the first diffusion barrier 150, the second diffusion barrier 142, and the first silicon oxide layer 144 of the first semiconductor chip 100. The fourth diffusion barrier 242 may be called a second organic layer. The second silicon oxide layer 244 may be called a second inorganic layer.

The second conductive pad 230 may have a width in the first direction D1 substantially the same as that of the first conductive pad 130. As shown in FIG. 1, the second conductive pad 230 may not be completely aligned with the first conductive pad 130 and, thus, the second conductive pad 230 may partially overlap and contact the first conductive pad 130.

No boundary may be visible at a contact surface between the first conductive pad 130 and the second conductive pad 230. No boundary may be visible at a contact surface between the second diffusion barrier 142 and the fourth diffusion barrier 242. No boundary may be visible between the first silicon oxide layer 144 and the second silicon oxide layer 244.

The second diffusion barrier 142 and the fourth diffusion barrier 242 may be disposed on a region where the first conductive pad 130 and the second conductive pad 230 are not in contact with each other between the first semiconductor chip 100 and the second semiconductor chip 200. The second diffusion barrier 142 of the first semiconductor chip 100 may contact the fourth diffusion barrier 242 of the second semiconductor chip 200, and a contact surface between the second and fourth diffusion barriers 142 and 242 may have a width W4 ranging from about 0.1 μm to about 0.3 μm in the first direction D1.

As discussed above, the semiconductor device 1 may have a hybrid bonding structure. For example, the top surface of the first conductive pad 130 may contact a top surface of the second conductive pad 230, and the second diffusion barrier 142 and the fourth diffusion barrier 242 may be positioned on a region where the first conductive pad 130 and the second conductive pad 230 are not in contact with each other.

The first and second diffusion barriers 142 and 242 each including an organic material may be provided around the conductive pads 130 and 230, and thus a metal element may be prevented from diffusing from the conductive pads 130 and 230 into their facing semiconductor chips. In addition, the first and second silicon oxide layers 144 and 244 may be provided therebelow with the first and second silicon oxide ($SiO_2$) layers 144 and 244 each having a good adhesive force and a large surface area, and thus a metal element may be prevented from diffusing into the first and second wiring layers 120 and 220. As a result, the semiconductor device 1 may exhibit a decreased leakage current.

FIGS. 4 to 10 illustrate cross-sectional views showing a method of fabricating the semiconductor device of FIG. 2. To avoid repetitive explanation, some elements discussed with reference to FIGS. 1 and 2 may not be described in detail again.

Figure 4:
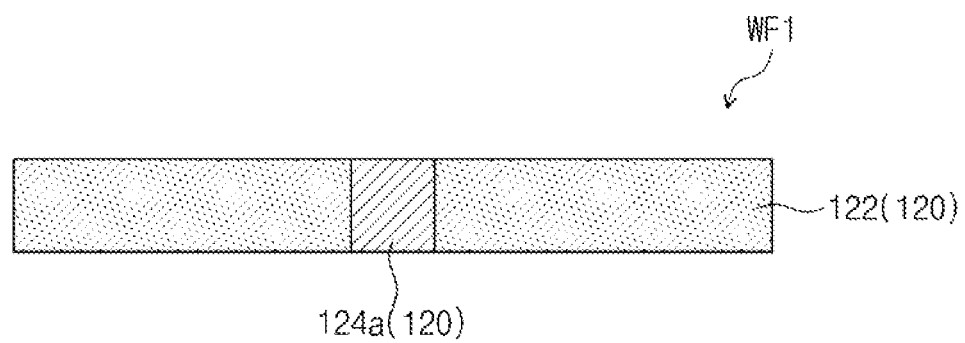
FIGS. 4 to 10 illustrate cross-sectional views showing a method of fabricating the semiconductor device of FIG. 2.

Referring to FIG. 4, a first wafer WF1 may be provided. The first wafer WF1 may include a first semiconductor substrate (not shown). A first wring layer 120 may be formed on the first semiconductor substrate. The first wiring layer 120 may include a first dielectric layer 122, and may also include first wiring lines and first vias 124a in the first dielectric layer 122. The first via 124a may be formed on an uppermost portion of the first dielectric layer 122.

Figure 5:
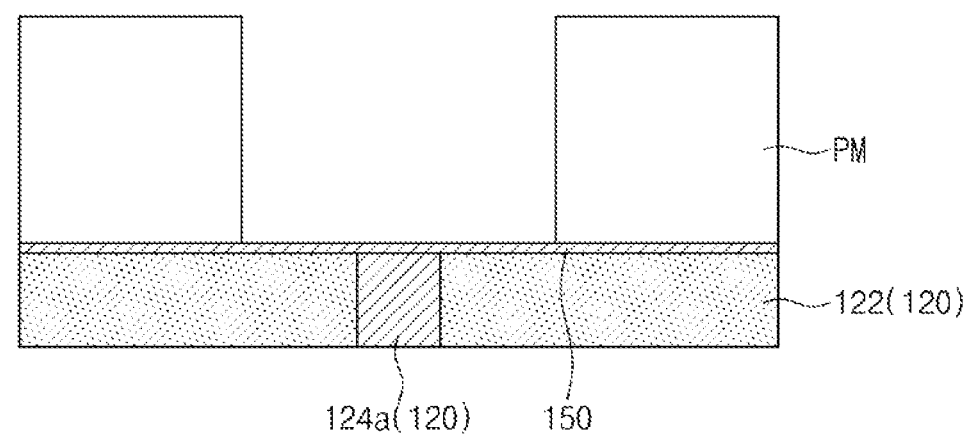

Referring to FIG. 5, a first diffusion barrier 150 may be formed on the first wiring layer 120. The first diffusion barrier 150 may be formed by, for example, atomic layer deposition (ALD). Although not shown, a seed layer may be formed on the first diffusion barrier 150. The seed layer may include copper. The seed layer may be formed by, for example, atomic layer deposition (ALD). A photoresist pattern PM may be formed to have an opening that vertically overlaps the first via 124a. The photoresist pattern PM may be formed by forming a photoresist layer and performing exposure and development processes. The photoresist pattern PM may include an opening that defines a position of a first conductive pad which will be formed later (see 130 of FIG. 6).

Figure 6:
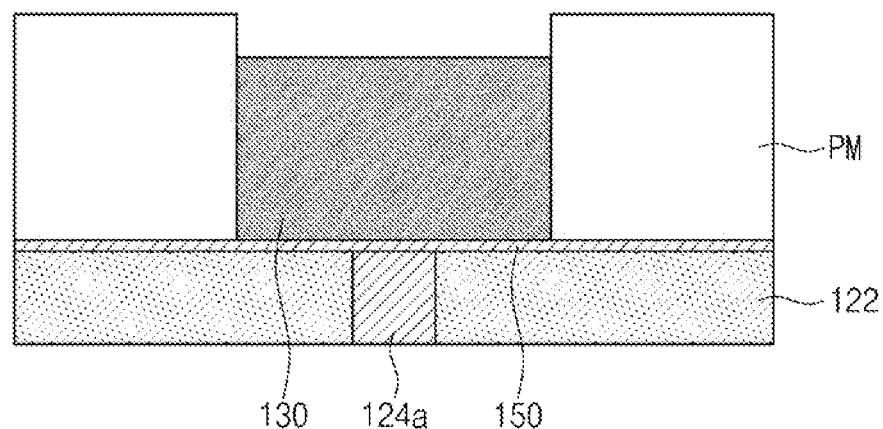

Referring to FIG. 6, the first conductive pad 130 may be formed. A seed layer (not shown) may be used as a seed for an electroplating process to form the first conductive pad 130. The seed layer may include the same material as that of the first conductive pad 130, and thus no boundary may be visible. For example, the seed layer and the first conductive pad 130 may constitute a single unitary body.

Figure 7:
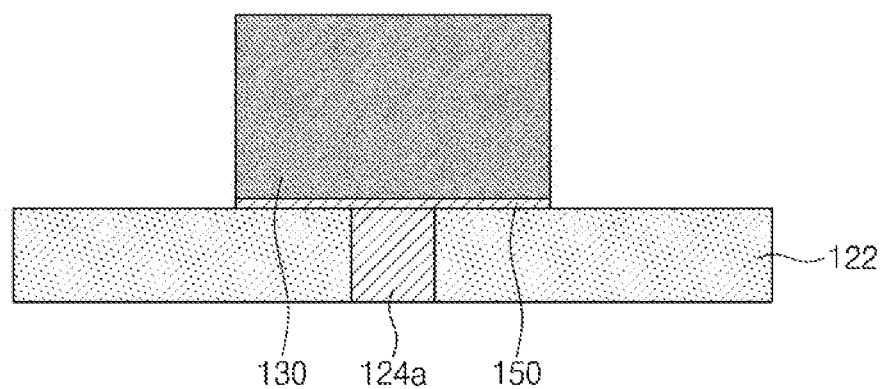

Referring to FIG. 7, the photoresist pattern PM may be removed. An etching process may be performed on the seed layer and on portions of the first diffusion barrier 150 that do not vertically overlap the first conductive pad 130. The etching process may be, for example, a wet etching process.

Figure 8:
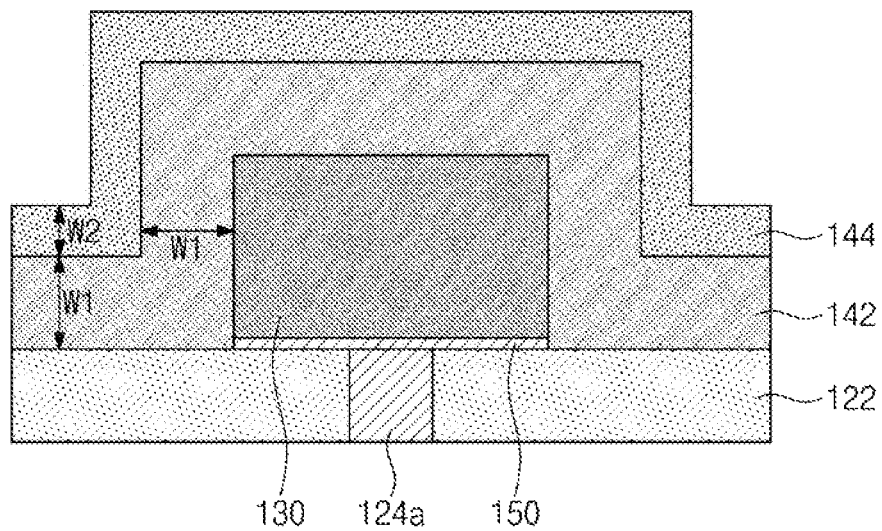

Referring to FIG. 8, a second diffusion barrier 142 and a first silicon oxide layer 144 may be formed to cover the first conductive pad 130. The second diffusion barrier 142 may be formed by, for example, spin coating. The second diffusion barrier 142 may be formed to cover top and lateral surfaces of the first conductive pad 130. At this stage, the second diffusion barrier 142 may contact the top and lateral surfaces of the first conductive pad 130. The first silicon oxide layer 144 may be formed on the second diffusion barrier 142, and may contact a top surface of the second diffusion barrier 142. The first silicon oxide layer 144 may be formed by, for example, chemical vapor deposition (CVD). The second diffusion barrier 142 may be formed to have a thickness W1 greater than a thickness W2 of the first silicon oxide layer 144.

Figure 9:
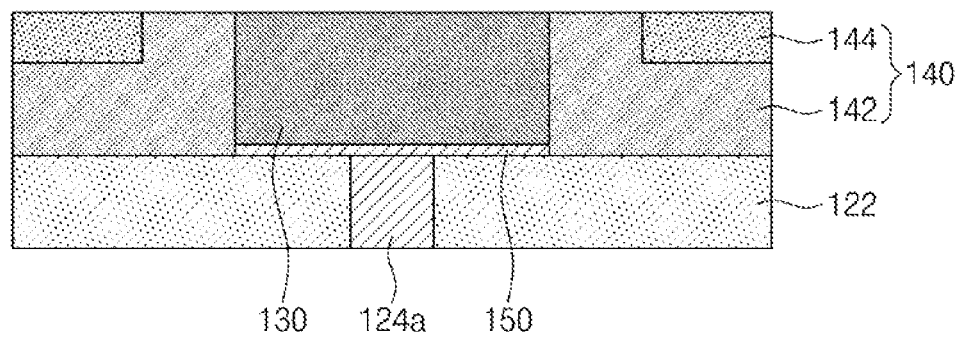

Referring to FIG. 9, a planarization process may be performed on a surface of the first wafer WF1. The planarization process may be, for example, a chemical mechanical polishing (CMP) process. The planarization process may continue until the top surface of the first conductive pad 130 becomes exposed. The exposed top surface of the first conductive pad 130 may be located at the same level as that of a top surface of the first silicon oxide layer 144. The planarization process may cause the second diffusion barrier 142 to have an exposed portion around the first conductive pad 130. The top surface of the first conductive pad 130, the exposed top surface of the second diffusion barrier 142, and the top surface of the first silicon oxide layer 144 may be substantially coplanar with each other. The second diffusion barrier 142 and the first silicon oxide layer 144 may constitute a first dielectric structure 140.

Figure 10:
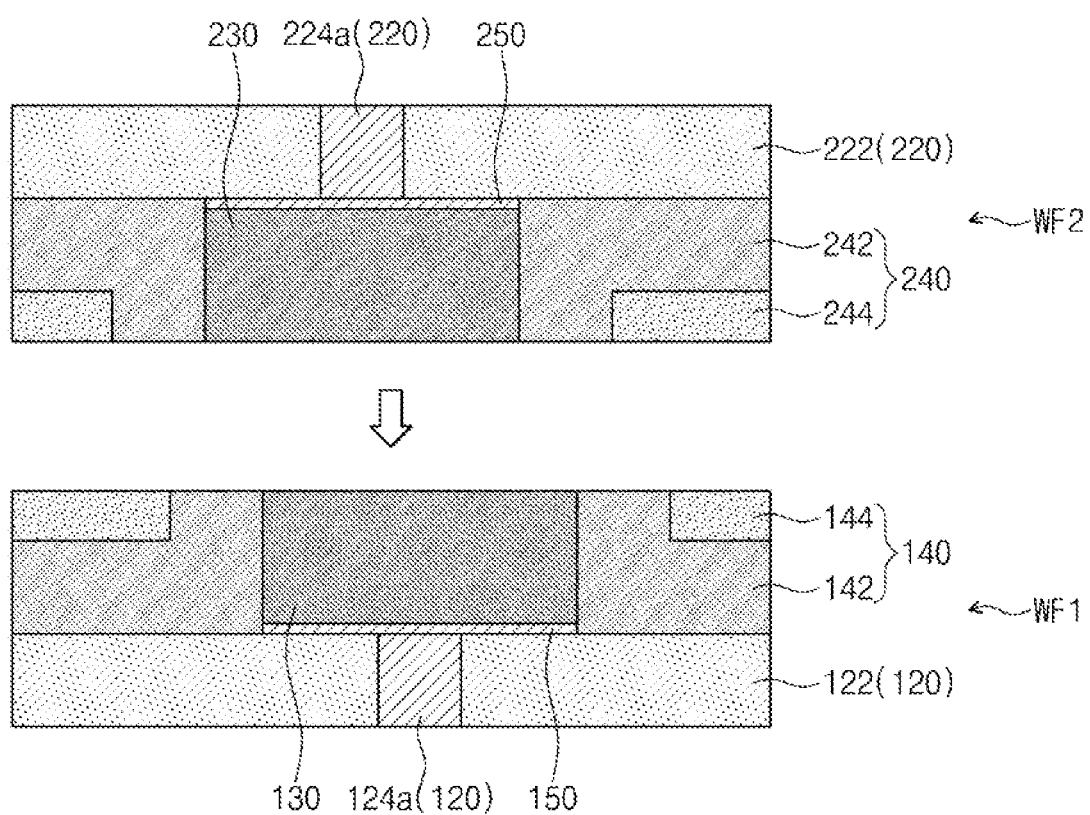

Referring to FIG. 10, processes discussed in FIGS. 4 to 9 may be performed to form a second wafer WF2 that includes the second semiconductor chip 200 of FIG. 1. The second wafer WF2 may include a second semiconductor substrate (not shown), a second wiring layer 220, a second conductive pad 230, a third diffusion barrier 250, and a second dielectric structure 240 that respectively correspond to the first semiconductor substrate (not shown), the first wiring layer 120, the first conductive pad 130, the first diffusion barrier 150, and the first dielectric structure 140 of the first wafer WF1. The second wiring layer 220 may include a second dielectric layer 222, and may also include second wiring lines (not shown) and second vias 224a in the second dielectric layer 222. The second dielectric structure 240 may include a fourth diffusion barrier 242 that corresponds to the second diffusion barrier 142, and may also include a second silicon oxide layer 244 that corresponds to the first silicon oxide layer 144.

The first wafer WF1 and the second wafer WF2 may be bonded to each other such that the first conductive pad 130 and the first dielectric structure 140 face the second conductive pad 230 and the second dielectric structure 240. An annealing process may be performed simultaneously with or after making contact between the first wafer WF1 and the second wafer WF2, thereby bonding the first wafer WF1 and the second wafer WF2 to each other.

A singulation or sawing process may be performed to fabricate the semiconductor device 1 of FIG. 1.

In fabricating a semiconductor chip, wafers may be bonded to each other to accomplish various purposes, such as an increase in integration or an improvement in function. Conductive pads, such as copper pads, on top surfaces of the wafers may be bonded to each other for structural and electrical connection between the wafers. In such cases, there may occur misalignment between the conductive pads when the wafers are bonded to each other, and thus during an annealing process, metal elements may diffuse into an adjacent dielectric layer from the conductive pads. However, even when a misalignment occurs during the bonding process, as shown in FIG. 2, the fourth diffusion barrier 242 may not allow copper atoms to diffuse from the first conductive pad 130 into the second wafer WF2, and the second diffusion barrier 142 may not allow copper atoms to diffuse from the second conductive pad 230 into the first wafer WF1.

FIGS. 11 to 16 illustrate cross-sectional views showing a method of fabricating a semiconductor package including a semiconductor device according to an example embodiment.

Although FIGS. 11 to 16 depict that first and second conductive pads 130 and 230 are connected in alignment, this is merely an example for convenience of illustration, and connection between the first and second conductive pads 130 and 230 may be partially misaligned as shown in FIGS. 1 and 2.

Figure 11:
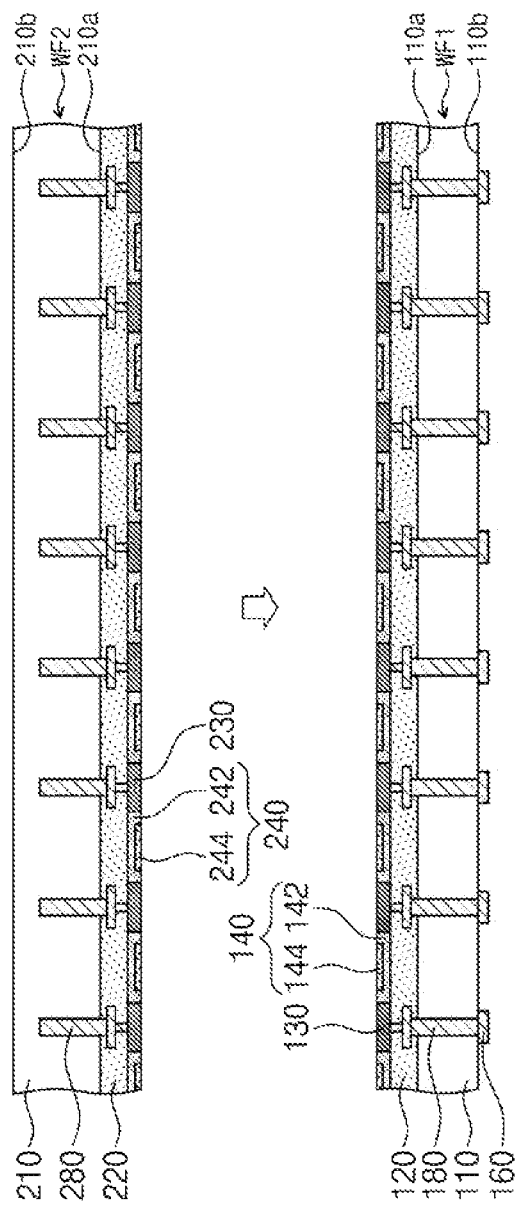
FIGS. 11 to 16 illustrate cross-sectional views showing a method of fabricating a semiconductor package including a semiconductor device according to an example embodiment.

Referring to FIG. 11, a first wafer WF1 may be provided. The first wafer WF1 may include a first semiconductor substrate 110, a first circuit layer, a first diffusion barrier, a first wiring layer 120, a first conductive pad 130, and a first dielectric structure 140.

The first semiconductor substrate 110 may have a front surface 110a and a rear surface 110b that are opposite to each other. The first semiconductor substrate 110 may undergo a thinning process to be made thinner. The first circuit layer may be disposed close to the front surface 110a of the first semiconductor substrate 110 and may include, for example, a memory circuit. The first wafer WF1 may include a first through via 180 that penetrates the first semiconductor substrate 110 and extends toward the first wiring layer 120, and may include a first terminal pad 160 connected to the first through via 180. Although not shown, a dielectric layer may be interposed between the first semiconductor substrate 110 and the first terminal pad 160. The first wafer WF1 may have a structure identical or similar to that in which are provided a plurality of first semiconductor chips 100 of FIGS. 1 and 2, except for the first circuit layer, the first through via 180, and the first terminal pad 160.

In an example embodiment, the first diffusion barrier 150 of FIG. 2 may be provided on a bottom surface of the first conductive pad 130, and the second diffusion barrier 142 of FIG. 2 including an organic material may be provided on a lateral surface of the first conductive pad 130.

A second wafer WF2 may be bonded to the first wafer WF1. The second wafer WF2 may include a second semiconductor substrate 210, a second circuit layer, a second diffusion barrier, a second wiring layer 220, a second conductive pad 230, and a second dielectric structure 240.

The second semiconductor substrate 210 may have a front surface 210a and a rear surface 210b that are opposite to each other. The second circuit layer may be disposed close to the front surface 210a of the second semiconductor substrate 210 and may include, for example, a memory circuit. The second circuit layer of the second wafer WF2 may include a circuit whose function is the same as that of a circuit included in the first circuit layer of the first wafer WF1. The second wafer WF2 may include a second through via 280 that penetrates a portion of the second semiconductor substrate 210 and extends toward the second wiring layer 220. A third diffusion barrier may be provided on a bottom surface of the second conductive pad 230, and a fourth diffusion barrier 242 including an organic material may be provided on a lateral surface of the second conductive pad 230. The second wafer WF2 may be substantially the same as the first wafer WF1, except that the second semiconductor substrate 210 may not be thinned.

Figure 12:
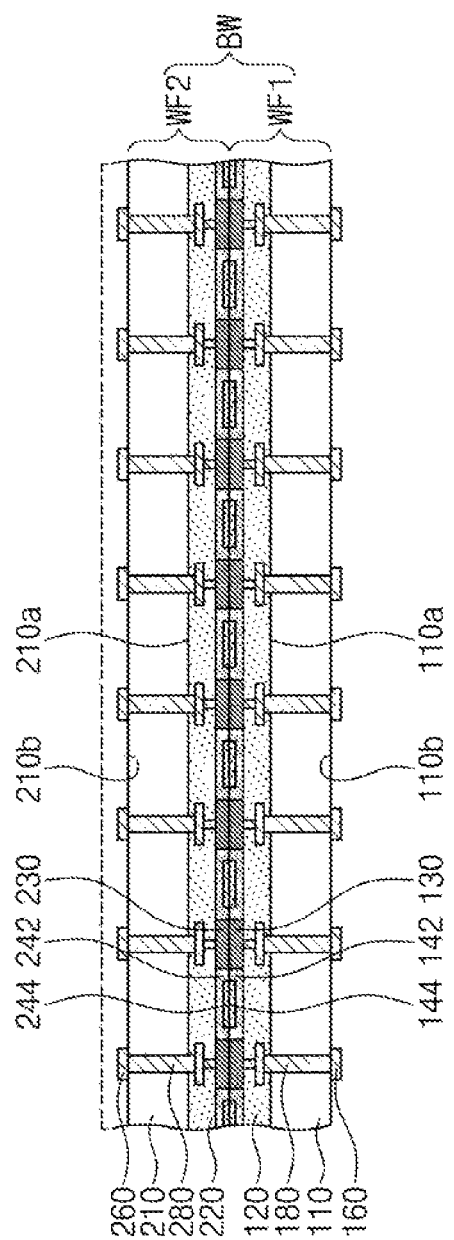

Referring to FIG. 12, an annealing process may be performed to bond the first wafer WF1 and the second wafer WF2 to each other with the front surface 110a of the first semiconductor substrate 110 facing the front surface 210a of the second semiconductor substrate 210. During the bonding process, like that shown in FIGS. 1 and 2, the first conductive pad 130 may have a top surface of which a portion contacts a top surface of the second conductive pad 230 and a remaining portion contacts the fourth diffusion barrier 242. In addition, the second diffusion barrier 142 may contact the top surface of the second conductive pad 230. For example, a top surface of the second conductive pad 230 adjacent to a portion thereof that is in contact with the top surface of the first conductive pad 130 may contact the second diffusion barrier 142.

The second wafer WF2 may be thinned. For example, the rear surface 210b of the second semiconductor substrate 210 may be polished to thin the second wafer WF2. As a result of the thinning process, the second through via 280 may be exposed or may protrude. The thinning of the second wafer WF2 may reduce a stack thickness of the first and second wafers WF1 and WF2. On the rear surface 210b of the second semiconductor substrate 210, second terminal pads 260 may be formed to have electrical connection with the second through vias 280. Although not shown, before the second terminal pads 260 are formed, a dielectric layer may be formed on the rear surface 210b of the thinned second semiconductor substrate 210. Thus, a wafer bonding structure BW may be formed in which the first wafer WF1 and the second wafer WF2 are bonded to each other.

Figure 13:
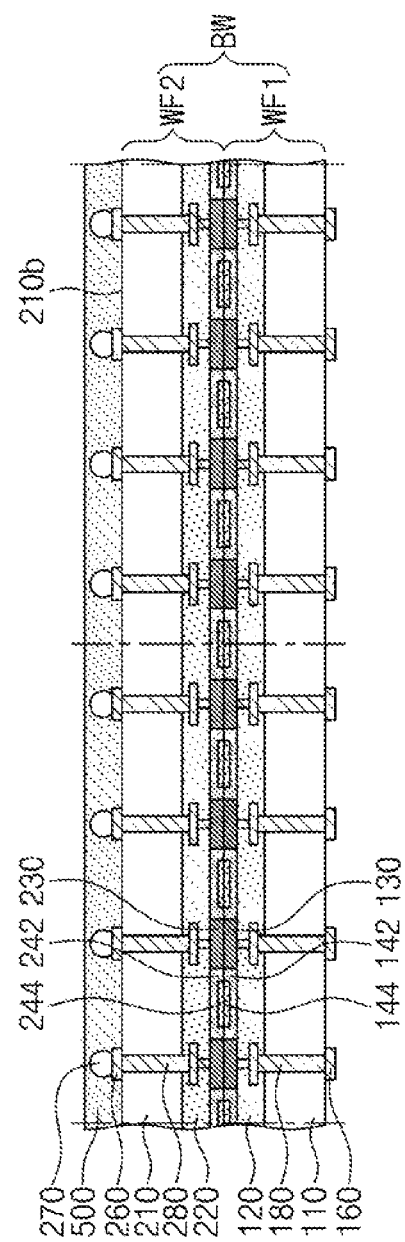
Figure 14:
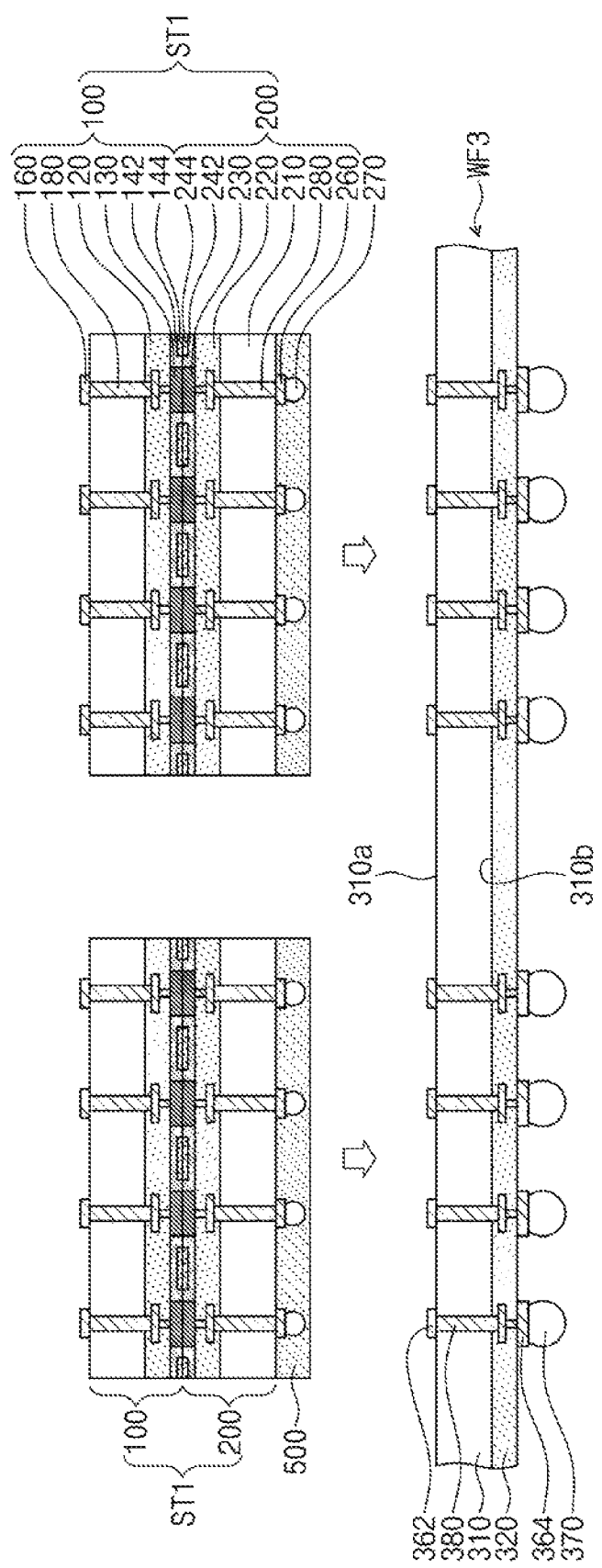

Referring to FIGS. 13 and 14, first connection terminals 270 may be formed on the second terminal pads 260. The first connection terminals 270 may be, for example, bumps. An adhesive layer 500 may be formed on the rear surface 210b of the second semiconductor substrate 210. The adhesive layer 500 may be, for example, a non-conductive film (NCF). A sawing process may be performed on the bonded first and second wafers WF1, WF2, for example, along a chain line indicated in FIG. 13.

The sawing process may covert the first wafer WF1 into a plurality of first semiconductor chips 100, and may also covert the second wafer WF2 into a plurality of second semiconductor chips 200. That is, the wafer bonding structure BW may be converted into a plurality of first semiconductor chip stacks ST1, each including the second semiconductor chip 200 and the first semiconductor chip 100 that are sequentially stacked.

Referring to FIG. 14, the first semiconductor chip stacks STI may be mounted on a third wafer WF3. The third wafer WF3 may include a third semiconductor substrate 310, a third circuit layer, a third wiring layer 320, an upper pad 362, a third through via 380, a lower pad 364, and an external connection terminal 370.

The third semiconductor substrate 310, the third wiring layer 320, and the third through via 380 may respectively correspond to the first semiconductor substrate 110, the first wiring layer 120, and the first through via 180 of the first wafer WF1 discussed above. The third semiconductor substrate 310 may have a first surface 310a and a second surface 320b that are opposite to each other, and the third circuit layer may be formed close to the first surface 310a. The third circuit layer may include, for example, a logic circuit. Although not shown, a dielectric layer may be interposed between the upper pad 362 and the third semiconductor substrate 310.

A thermocompression process may be performed with the first connection terminal 270 of the first semiconductor chip stack ST1 aligned with the upper pad 362 of the third wafer WF3.

Figure 15:
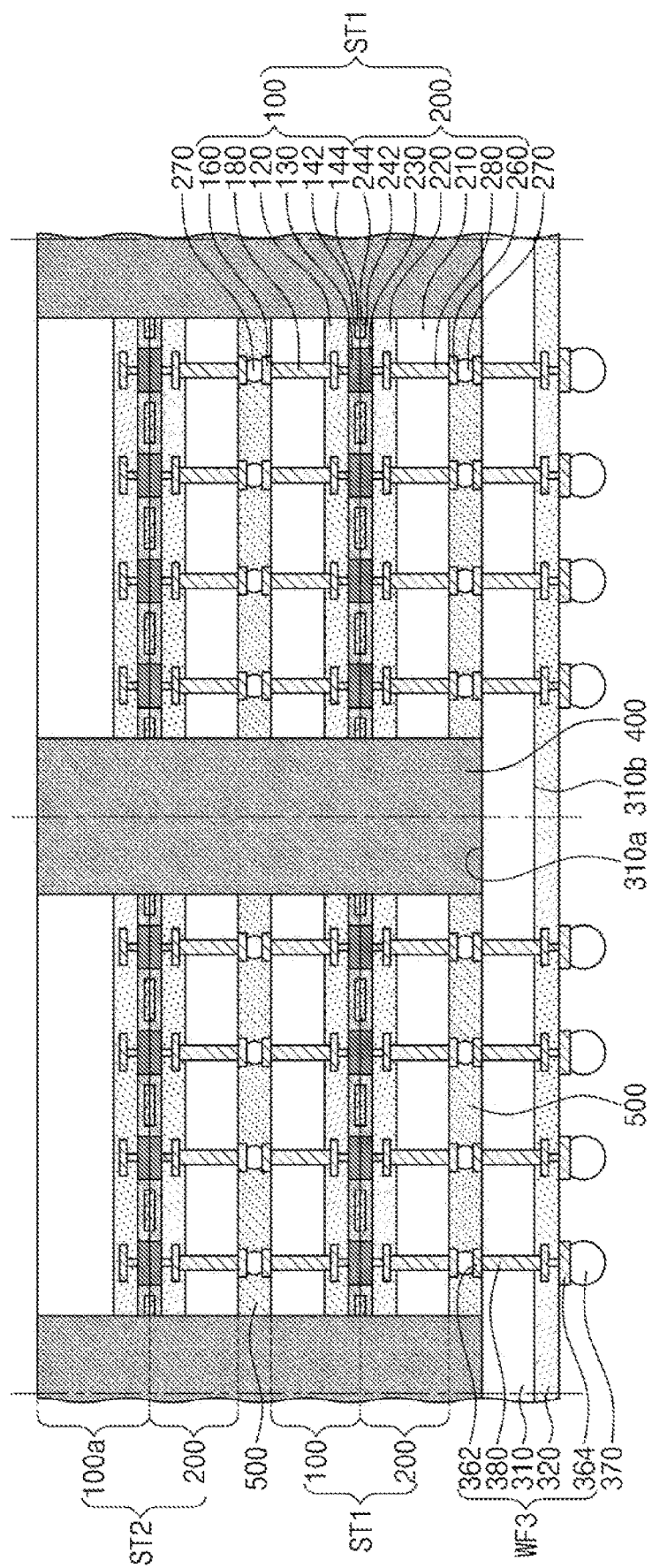
Figure 16:
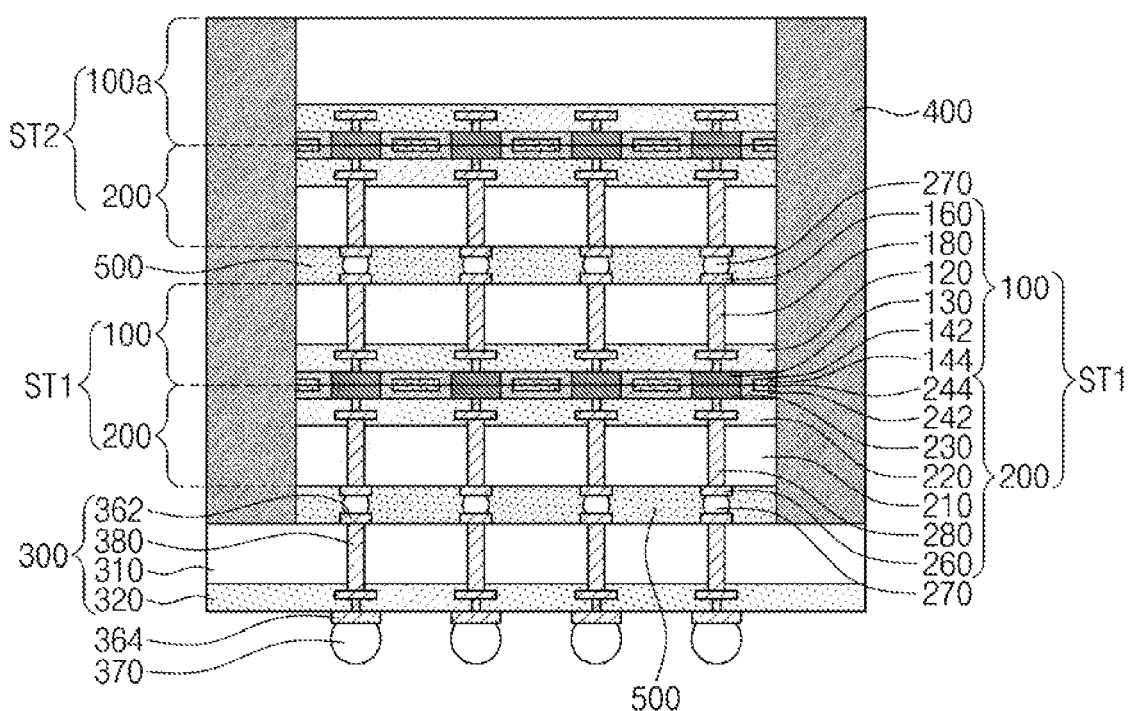

Referring to FIGS. 15 and 16, a second semiconductor chip stack ST2 may be formed in the same or similar way as the first semiconductor chip stack STI is formed as discussed in FIGS. 11 to 14. The second semiconductor chip stack ST2 may include the second semiconductor chip 200 and a first semiconductor chip 100a that are sequentially stacked. Unlike the first semiconductor chip 100 of the first semiconductor chip stack ST1, the first semiconductor chip 100a of the second semiconductor chip stack ST2 may include neither the first through via 180 nor the first terminal pad 160. The first semiconductor chips 100 and 100a and the second semiconductor chip 200 included in the first and second semiconductor chip stacks ST1 and ST2 may be the same chip with the same memory circuit.

The second semiconductor chip stack ST2 may be attached onto the first semiconductor chip stack ST1. A thermocompression process may be performed with the first connection terminal 270 of the second semiconductor chip stack ST2 in contact with the first terminal pad 160 of the first semiconductor chip stack ST1.

A molding member 400 may be formed to cover the first surface 310a of the third semiconductor substrate 310, a lateral surface of the first semiconductor chip stack ST1, a lateral surface of the second semiconductor chip stack ST2, and a lateral surface of the adhesive layer 500. The molding member 400 may include, for example, an epoxy molding compound (EMC). The molding member 400 and the third wafer WF3 may undergo a sawing process, for example, along a chain line shown in FIG. 15. The sawing process may convert the third wafer WF3 into a plurality of third semiconductor chips 300, and thus a semiconductor package 2 may be fabricated as shown in FIG. 16.

FIGS. 17 to 21 illustrate cross-sectional views showing a method of fabricating a semiconductor package including a semiconductor device according to an example embodiment.

Although FIGS. 18 to 21 depict that first and second conductive pads 130 and 730 are connected in alignment and first and third conductive pads 130 and 830 are connected in alignment, connection between the first and second conductive pads 130 and 730 (or the first and third conductive pads 130 and 830) may be partially misaligned as shown in FIGS. 1 and 2.

Figure 17:
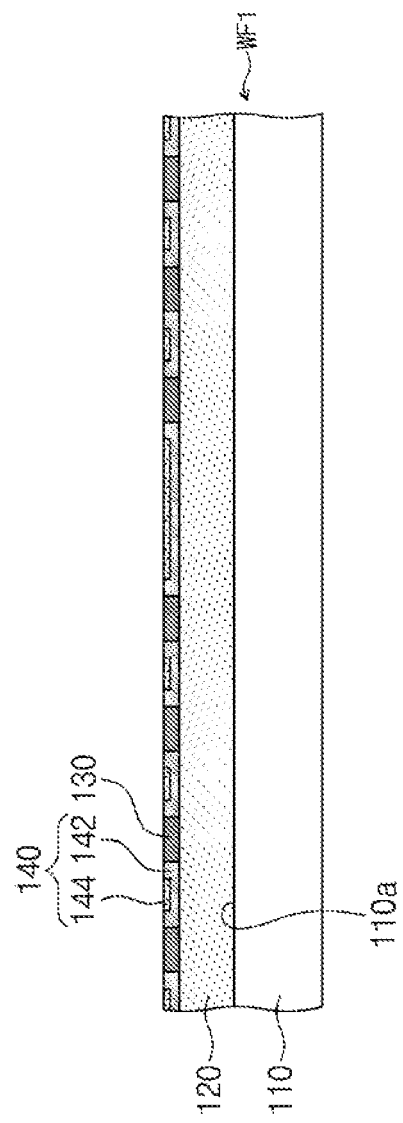
FIGS. 17 to 21 illustrate cross-sectional views showing a method of fabricating a semiconductor package including a semiconductor device according to an example embodiment.

Referring to FIG. 17, a first wafer WF1 may be provided. The first wafer WF1 may include a first semiconductor substrate 110, a first circuit layer, a first diffusion barrier, a first wiring layer 120, a first conductive pad 130, and a first dielectric structure 140.

The first circuit layer may be disposed close to a front surface 110a of the first semiconductor substrate 110 and may include, for example, a logic circuit. The first wafer WF1 may have a structure identical or similar to that in which are disposed a plurality of first semiconductor chips 100 of FIGS. 1 and 2, except for the first circuit layer. For example, the first diffusion barrier 150 of FIG. 2 may be provided on a bottom surface of the first conductive pad 130, and the second diffusion barrier 142 of FIG. 2 including an organic material may be provided on a lateral surface of the first conductive pad 130.

Figure 18:
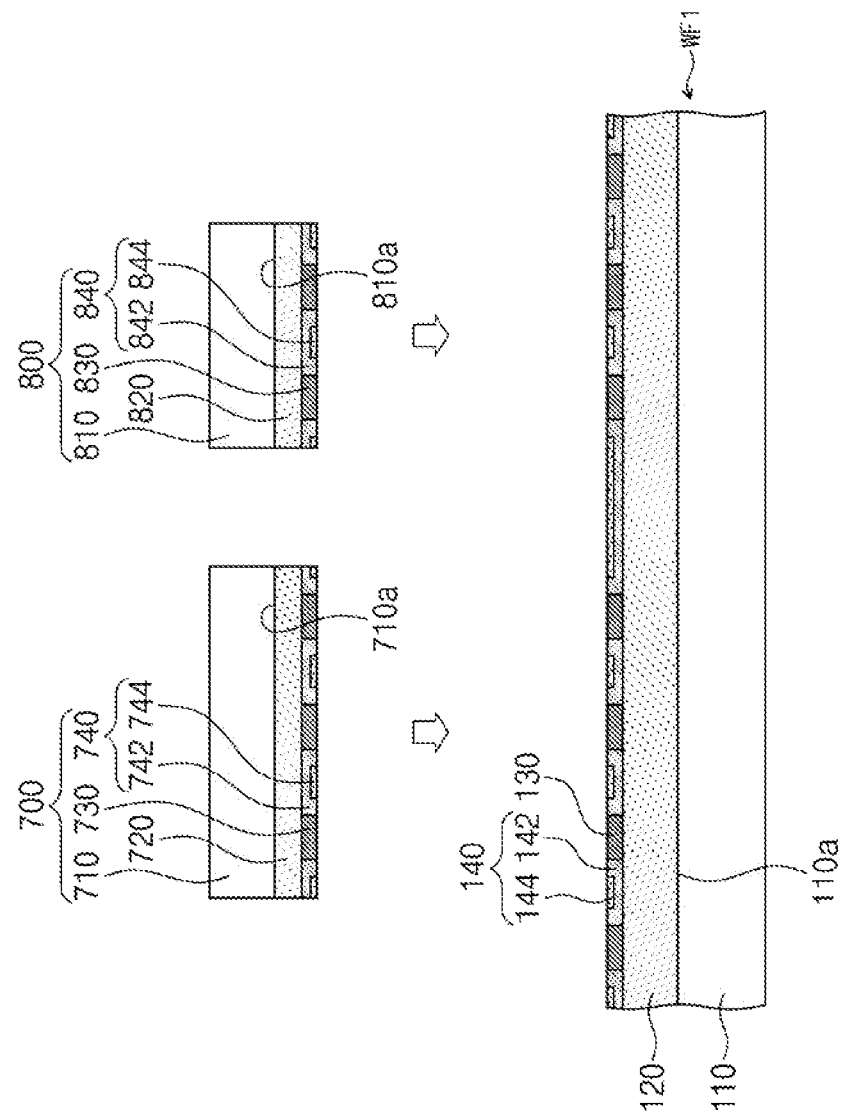

Referring to FIG. 18, a second semiconductor chip 700 and a third semiconductor chip 800 may be provided on the front surface 110a of the first semiconductor substrate 110.

The second semiconductor chip 700 may include a second semiconductor substrate 710, a second circuit layer, a third diffusion barrier, a second wiring layer 720, a second conductive pad 730, and a second dielectric structure 740. The second circuit layer may be disposed close to a front surface 710a of the second semiconductor substrate 710 and may include, for example, a memory circuit. The third diffusion barrier, the second wiring layer 720, the second conductive pad 730, and the second dielectric structure 740 may respectively correspond to the first diffusion barrier, the first wiring layer 120, the first conductive pad 130, and the first dielectric structure 140 of the first wafer WF1. For example, the second conductive pad 730 may be provided with the third diffusion barrier on its surface opposite to its exposed surface, and may also be provided on its lateral surface with a fourth diffusion barrier 742 including an organic material. A second silicon oxide layer 744 may be provided on the fourth diffusion barrier 742.

The third semiconductor chip 800 may include a third semiconductor substrate 810, a third circuit layer, a fifth diffusion barrier, a third wiring layer 820, a third conductive pad 830, and a third dielectric structure 840.

The third circuit layer may be disposed close to a front surface 810a of the third semiconductor substrate 810 and may include a circuit whose type is the same as or different from that of the circuit included in the second circuit layer. When the third circuit layer includes the same type circuit as that of the second circuit layer, the third circuit layer may include a memory circuit. For example, the second and third semiconductor chips 700 and 800 may be of the same or different types.

The fifth diffusion barrier, the third wiring layer 820, the third conductive pad 830, and the third dielectric structure 840 may respectively correspond to the first diffusion barrier, the first wiring layer 120, the first conductive pad 130, and the first dielectric structure 140 of the first wafer WF1. For example, the second conductive pad 730 may be provided with the fifth diffusion barrier on its surface opposite to its exposed surface, and may also be provided on its lateral surface with a sixth diffusion barrier 842 including an organic material. A third silicon oxide layer 844 may be provided on the sixth diffusion barrier 842.

Figure 19:
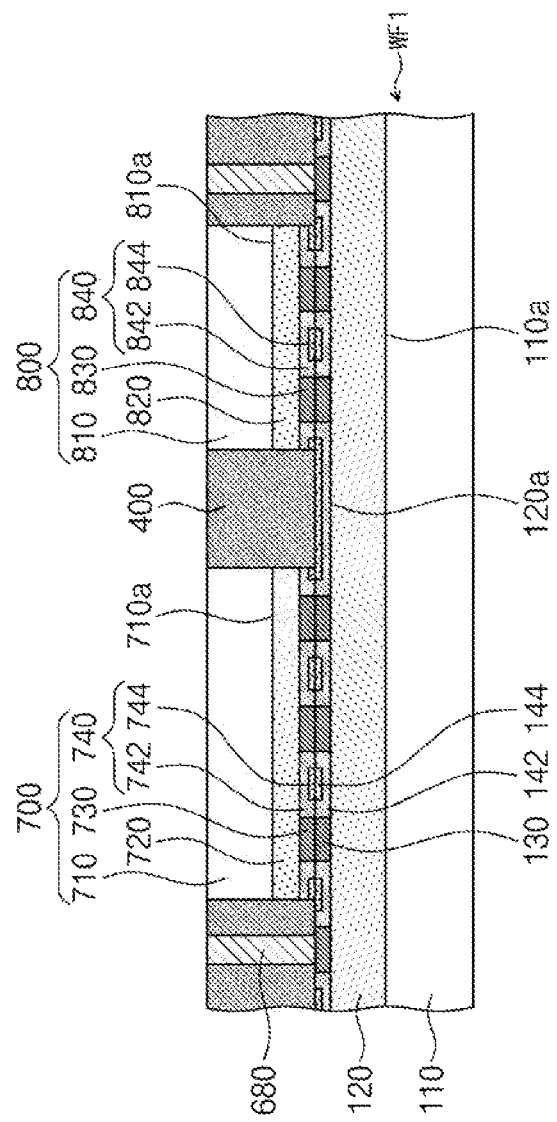

Referring to FIG. 19, an annealing process may be performed to bond both the second and third semiconductor chips 700 and 800 to the first wafer WF1 with the front surface 110a of the first semiconductor substrate 110 facing both the front surface 710a of the second semiconductor substrate 710 and the front surface 810a of the third semiconductor substrate 810.

During the bonding process, ones of a plurality of first conductive pads 130 may be coupled to a plurality of second conductive pads 730, and other ones of the plurality of first conductive pads 130 may be coupled to a plurality of third conductive pads 830. Identically or similarly to that shown in FIGS. 1 and 2, the first conductive pads 130 may each have a top surface of which at least a portion is coupled to a top surface of a corresponding one of the second conductive pads 730, and the fourth diffusion barrier 742 may partially contact the top surface of the first conductive pad 130. In addition, the first conductive pads 830 may each have a top surface of which at least a portion is coupled to a top surface of a corresponding one of the third conductive pads 830, and the sixth diffusion barrier 842 may partially contact the top surface of the first conductive pad 130.

A conductive pillar 680 may be formed on at least a portion of each of remaining first conductive pads 130 in contact with neither the second conductive pads 730 nor the third conductive pads 830. The conductive pillar 680 may include, for example, copper. The conductive pillar 680 may be formed by forming a photoresist pattern that defines a position on which the conductive pillar 680 will be formed, performing an electroplating process to deposit a conductive material, and removing the photoresist pattern. A molding member 400 may be formed to cover one surface 120a of the first wiring layer 120, a lateral surface of the conductive pillar 680, a lateral surface of the second semiconductor chip 700, and a lateral surface of the third semiconductor chip 800.

Figure 20:
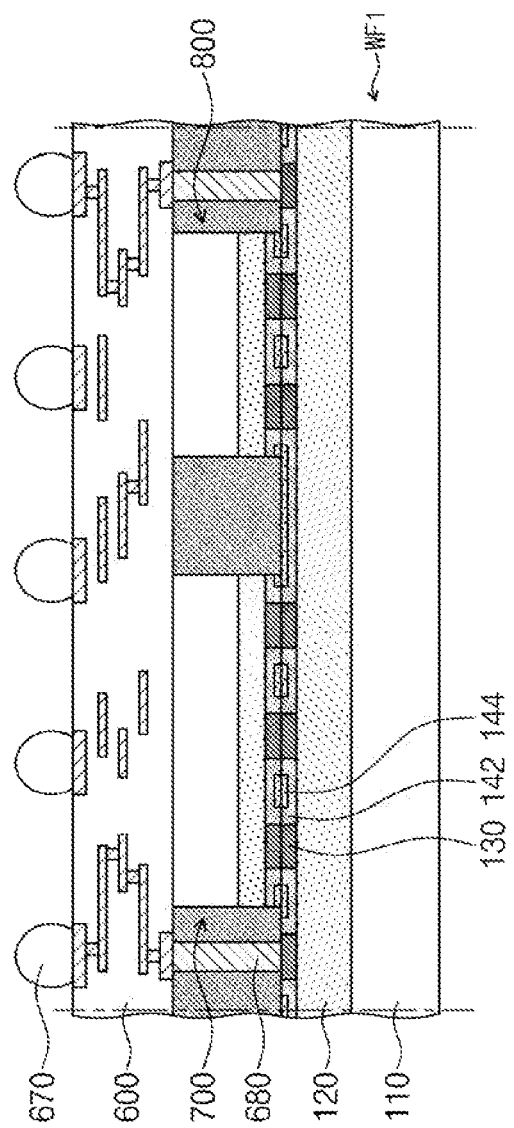
Figure 21:
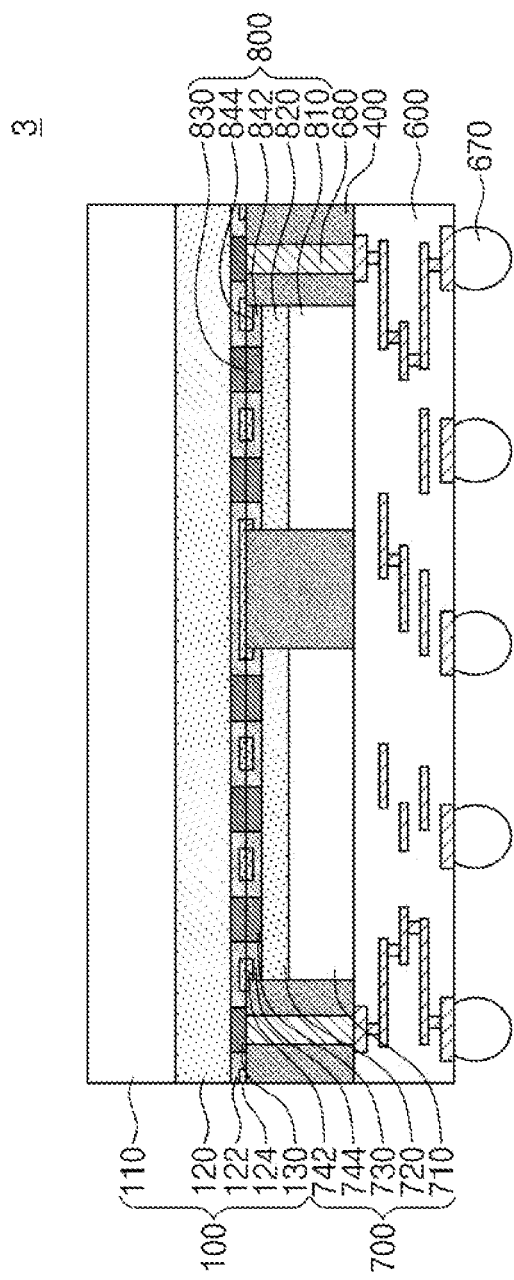

Referring to FIGS. 20 and 21, a redistribution substrate 600 may be formed on the molding member 400. The redistribution substrate 600 may include at least one redistribution layer. The redistribution substrate 600 may be electrically connected through the conductive pillar 680 to the first wafer WF1. An external connection terminal 670 may be formed on the redistribution substrate 600. The external connection terminal 670 may be, for example, one of solder balls, bumps, and pillars. A sawing process may be performed, for example along a chain line shown in FIG. 20, to convert the first wafer WF1 into a plurality of first semiconductor chips 100. As a result, a semiconductor package 3 may be fabricated as shown in FIG. 21.

According to an example embodiment, a semiconductor device may be configured such that a diffusion barrier including an organic material is provided around conductive pads. The diffusion barrier may prevent the diffusion of metal elements from the conductive pads to an adjacent dielectric layer. Accordingly, it may be possible to improve leakage-current characteristics of semiconductor chips.

As described above, example embodiments may provide a semiconductor device in which, when wafers with conductive pads are bonded to each other, a metal element is suppressed from diffusing from the conductive pads into an adjacent dielectric layer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor package, the method comprising:
preparing a first wafer and a second wafer; and
bonding the first wafer and the second wafer,
wherein preparing the first wafer and the second wafer includes:
forming a first diffusion barrier layer on a semiconductor substrate;
forming a conductive pad on the first diffusion barrier layer;
removing a portion of the first diffusion barrier layer using the conductive pad as a mask;
forming a second diffusion barrier layer covering an upper surface and a side surface of the conductive pad;
forming a dielectric layer on the second diffusion barrier layer; and
performing a planarization process to expose the conductive pad,
wherein the forming of the dielectric layer on the second diffusion barrier layer is performed prior to the performing of the planarization process.

2. The method as claimed in claim 1,
wherein the dielectric layer is a silicon oxide layer, and
wherein the planarization process is performed until a level of the upper surface of the conductive pad is the same as a level of an upper surface of the silicon oxide.

3. The method as claimed in claim 1,
wherein forming the conductive pad includes:
forming a photoresist pattern including an opening on the first diffusion barrier layer;
filling the opening with a conductive material by an electroplating method; and
removing the photoresist pattern.

4. The method as claimed in claim 1,
wherein forming the first diffusion barrier layer includes using an atomic layer deposition method.

5. The method as claimed in claim 1,
wherein forming the second diffusion barrier layer includes using a spin coating method.

6. The method as claimed in claim 1,
wherein removing a portion of the first diffusion barrier layer includes wet etching.

7. The method as claimed in claim 1,
wherein a thickness of the second diffusion barrier layer is greater than a thickness of the first diffusion barrier layer.

8. The method as claimed in claim 1,
wherein forming the conductive pad includes forming a seed layer on the first diffusion barrier layer.

9. The method as claimed in claim 1,
wherein the second diffusion barrier layer is in contact with the side surface of the conductive pad.

10. The method as claimed in claim 1,
wherein the second diffusion barrier layer includes an organic material.

11. The method as claimed in claim 1,
wherein the first diffusion barrier layer includes a metal.

12. The method as claimed in claim 1, further comprising sawing the first wafer and the second wafer after bonding the first wafer and the second wafer.

13. The method as claimed in claim 1,
wherein the first diffusion barrier layer includes one or more stacked structures of titanium (Ti), tantalum (Ta), titanium nitride (TiN), and tantalum nitride (TaN).

14. The method as claimed in claim 1,
wherein the second diffusion barrier layer includes at least one of polyimide (PI), polybenzoaxzole (PBO), and polyhydroxystyrene (PHS).

15. A method of manufacturing a semiconductor package, the method comprising:
preparing a first wafer and a second wafer;
bonding the first wafer and the second wafer;
wherein preparing the first wafer and the second wafer includes:
forming a conductive pad on a semiconductor substrate;
forming an organic layer covering an upper surface and a side surface of the conductive pad;
forming a silicon oxide layer on the organic layer before the bonding of the first wafer and the second wafer; and
performing a planarization process to expose the conductive pad.

16. The method as claimed in claim 15,
wherein the organic layer includes at least one of polyimide (PI), polybenzoaxzole (PBO), and polyhydroxystyrene (PHS).

17. The method as claimed in claim 15,
wherein the organic layer is in contact with the side surface of the conductive pad.

18. The method as claimed in claim 15,
wherein the silicon oxide layer is spaced apart from the conductive pad with the organic layer interposed therebetween.

19. The method as claimed in claim 15,
wherein a thickness of the organic layer is greater than a thickness of the silicon oxide layer.

20. The method as claimed in claim 15,
wherein, after the planarization process, the upper surface of the conductive pad, an upper surface of the organic layer, and an upper surface of the silicon oxide layer form a coplanar surface.

* * * * *